United States Patent [19]

Nagaba

[11] Patent Number: 5,724,281
[45] Date of Patent: Mar. 3, 1998

[54] SEMICONDUCTOR INTEGRATED CIRCUIT HAVING IMPROVED WIRING IN INPUT TERMINAL

[75] Inventor: Katsushi Nagaba, Kawasaki, Japan

[73] Assignee: Kabushiki Kaisha Toshiba, Tokyo, Japan

[21] Appl. No.: 790,466

[22] Filed: Jan. 29, 1997

[30] Foreign Application Priority Data

Jan. 31, 1996 [JP] Japan .................................. 8-015657

[51] Int. Cl.$^6$ .................................................. G11C 13/00
[52] U.S. Cl. .................. 365/63; 365/230.08; 365/189.05
[58] Field of Search .............................. 365/63, 230.08, 365/230.03, 189.05, 189.01, 222

[56] References Cited

U.S. PATENT DOCUMENTS 5,471,157  11/1995  McClure .......................... 365/230.08
5,615,166  3/1997  Machida .......................... 365/230.08

*Primary Examiner*—Vu A. Le
*Attorney, Agent, or Firm*—Loes & Loeb LLP

[57] ABSTRACT

The input pads DQ0 to DQ3 and the input buffers DIB0 to DIB3 are connected to each other by means of the wires La or Lb. In the case where the memory cell array is of the ×4 bit pattern, the input pads DQ0 to DQ3 are connected to the input terminals of the input buffers DIB0 to DIB3, respectively, via the wires La, whereas in the case where the memory cell array is of the ×1 bit pattern, one of the input pads, that is, DQ0 is connected to each of the input terminals of the input buffers DIB0 to DIB3 via the wires Lb. The structures from the input buffers DIB0 to DIB3 to the memory cell arrays are the same and common to the ×4 bit pattern and the ×1 bit pattern, and therefore an increase in the driving performance of the transistors in the input buffers DIB0 to DIB3 can be suppressed.

18 Claims, 6 Drawing Sheets

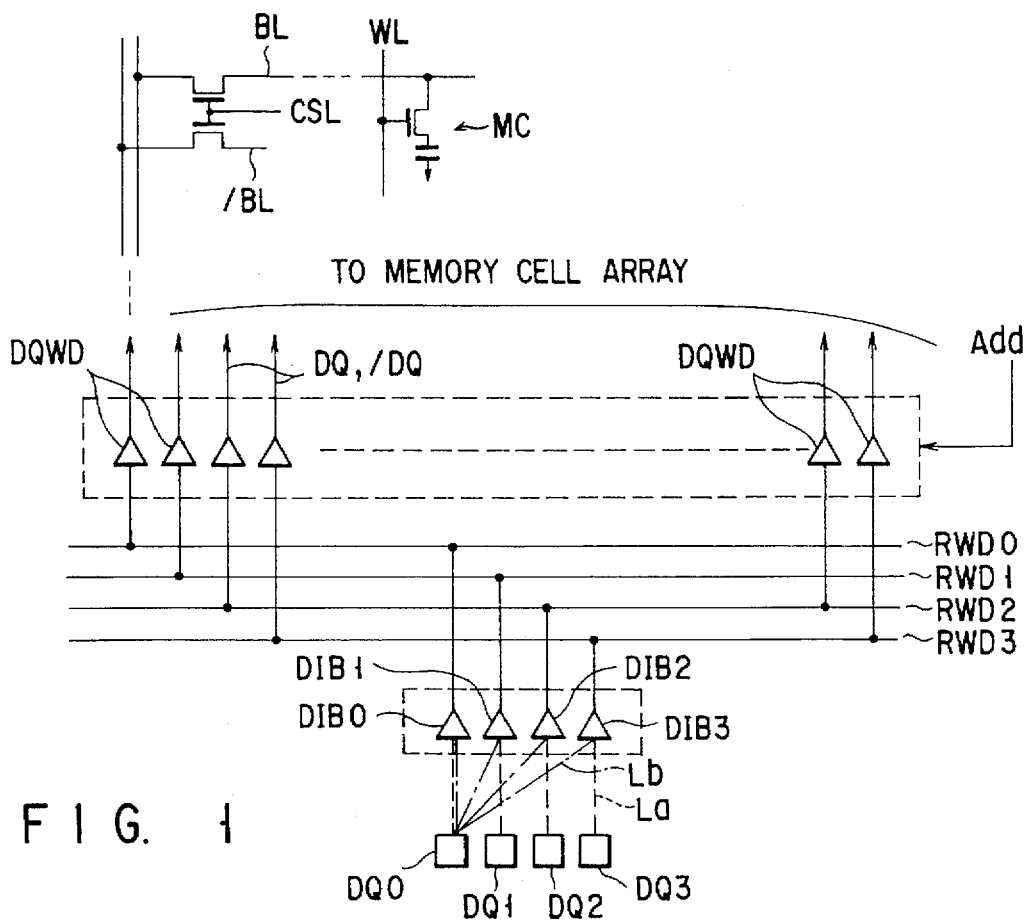
F I G. 1
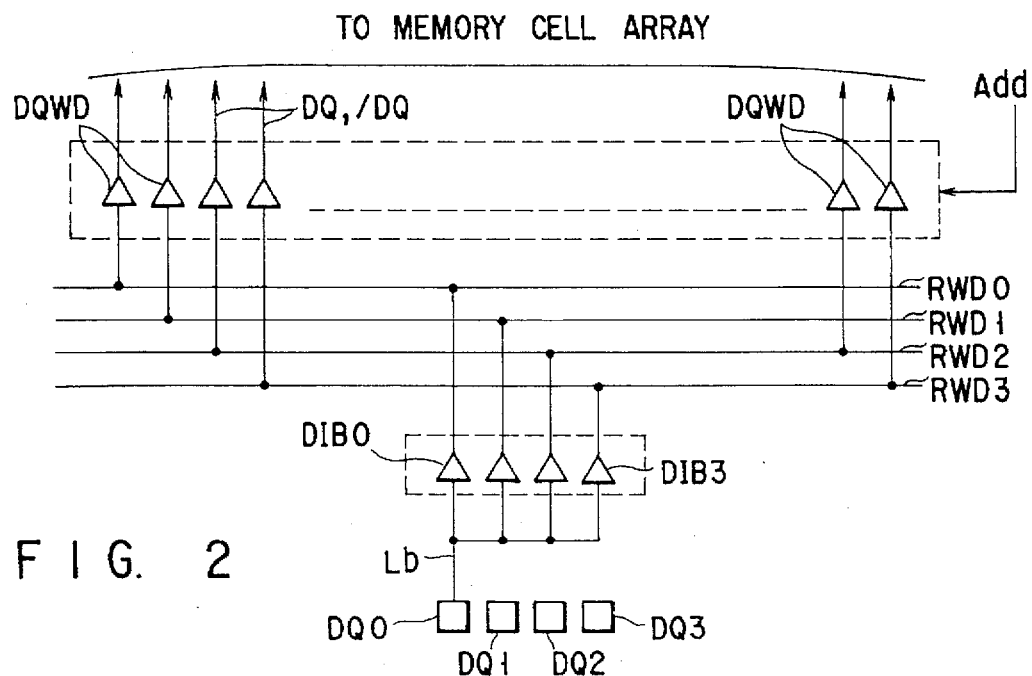
F I G. 2

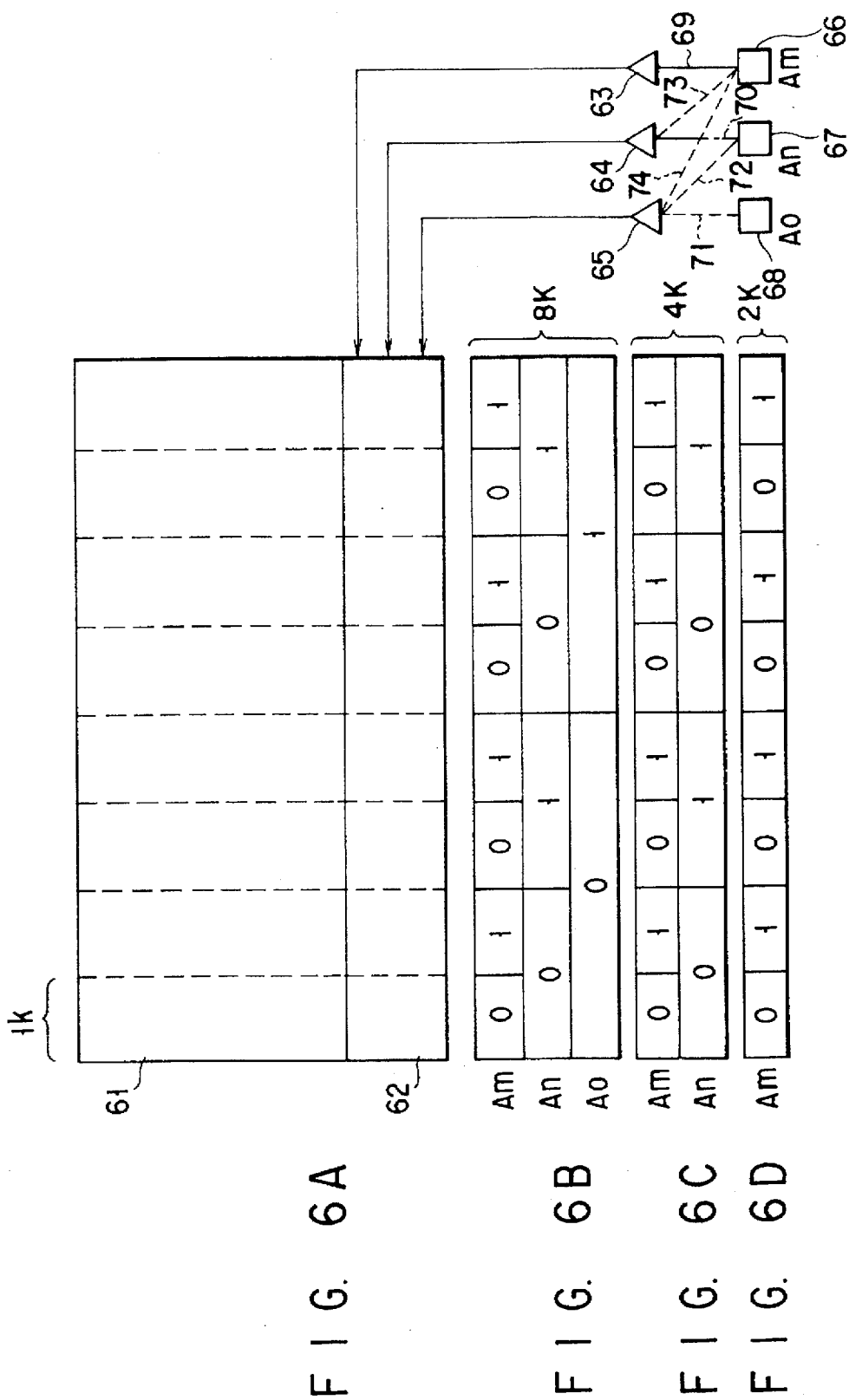

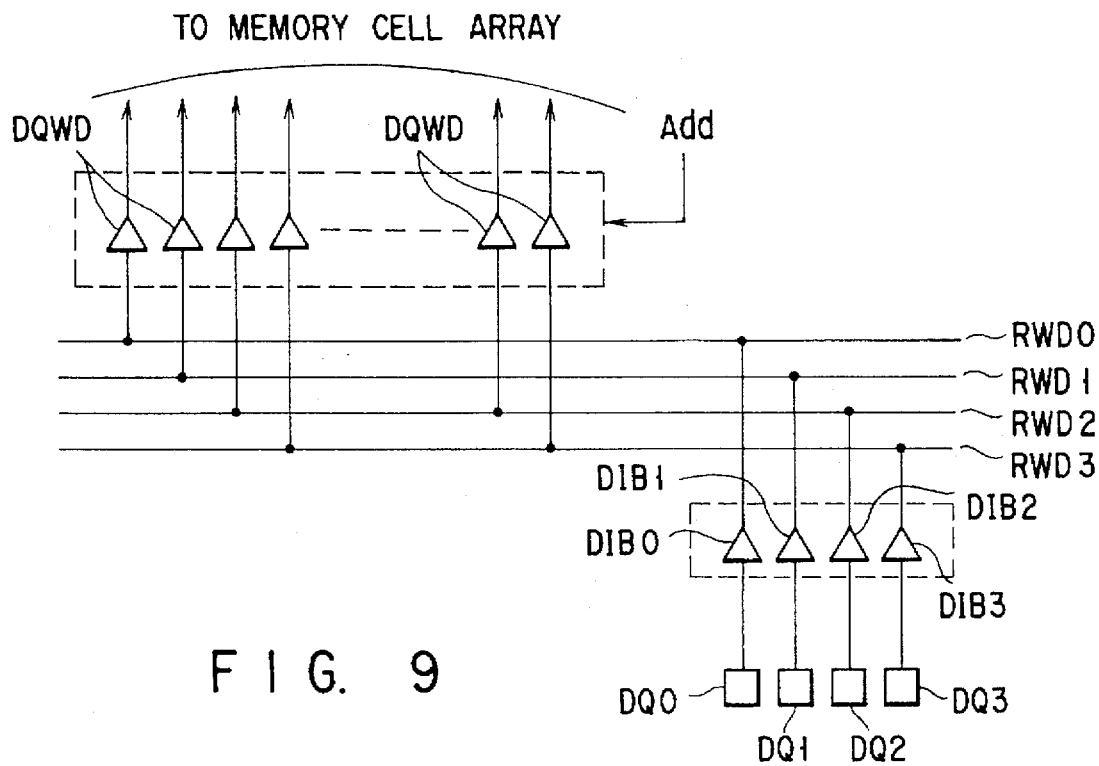
F I G. 9
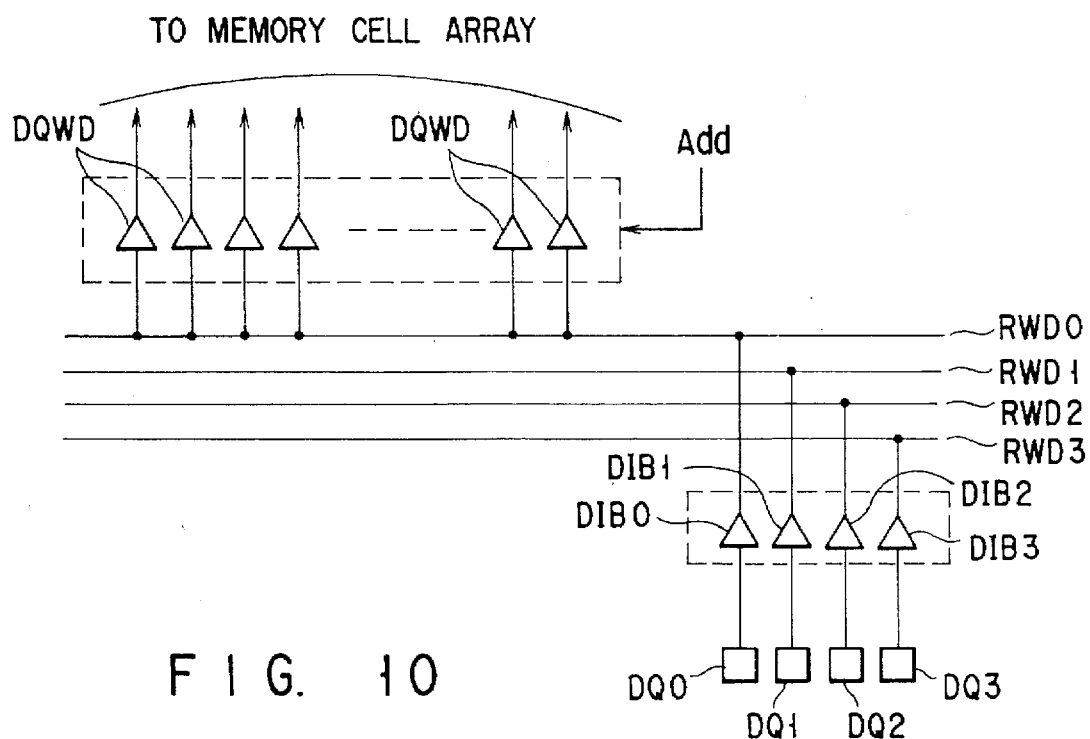
F I G. 10

ı

SEMICONDUCTOR INTEGRATED CIRCUIT HAVING IMPROVED WIRING IN INPUT TERMINAL

BACKGROUND OF THE INVENTION

The present invention relates to a semiconductor integrated circuit device such as a dynamic RAM (DRAM) or a synchronous DRAM.

FIG. 7 shows the structure of a general DRAM chip. As can be seen in this figure, a plurality of memory cell arrays 1 are provided in a semiconductor substrate. A row decoder 2 for selecting a word line is provided between each adjacent pair of memory cell arrays 1. In each of the memory cell arrays 1, there are provided a column decoder 3 for selecting a bit line, and a write driver/read amplifier group 4 made of a write driver for writing input data in a memory cell and a read amplifier for outputting data read out from a memory cell. Between pairs of the column decoders 3, a control circuit group 5 is provided, and input/output lines RWD for transmitting input data and output data are arranged along the write driver/read amplifier groups 4. Although they are not shown in the figure, pads for inputting/outputting data are on these input/output lines RWD. These input/output lines RWD are connected to the write driver/read amplifier group 4 and the control circuit group 5.

FIG. 8 shows details of a circuit which constitutes a part of the structure shown in FIG. 7. In a memory cell array 1, word lines WL are arranged in a vertical direction and bit lines BL are arranged in a horizontal direction. A memory cell is provided at each of intersections where the word lines WL and the bit lines BL cross with each other. A word line WL is selected by the row decoder 2, whereas a bit line BL is selected by the column decoder 3. In order to control the capacity of a bit line at low, the memory cell array 1 is divided into a plurality of sub-arrays 11. In each of the sub-arrays 11, bit lines BL and/BL (symbol/indicates a reverse signal) are selected by column selection signals CSL (A), CSL(A+1), ..., output from the column decoder 3, and they are connected to data lines DQ and/DQ arranged for each sub-array. The data lines DQ and/DQ are connected to the input/output lines (expressed by RWDn (n=0 to 3)) via the write driver DQWD and the read amplifier DQRA. To the input/output lines RWDn, input buffers DIB0 to DIB3 for inputting data and output buffers DOB0 to DOB3 for outputting data are connected respectively, and further pads DQ0 to DQ3 are connected to the input buffers DIB0 to DIB3 for inputting data and the output buffers DOB0 to DOB3 for outputting data, respectively.

A data writing is carried out in the following manner. That is, data supplied to the input buffers DIB0 to DIB3 via the pads DQ0 to DQ3 are further supplied to the write driver DQWD via the input/output lines REDn. Then, the data supplied to the input/output lines RWDn are transmitted to the data lines DQ and/DQ via the write driver DQWD. The data transmitted to the data lines DQ and/DQ are written in a memory cell selected.

On the other hand, a data reading is performed in the following manner. That is, a signal read out from a selected memory cell is supplied to the read amplifier DQRA via the data lines DQ and /DQ. The signal output from the read amplifier DQRA is transmitted to the input/output line RWDn, and the signal transmitted to the input/output line RWDn is output via the output buffer DOB0 to DOB3 and the pads DQ0 to DQ3.

In a DRAM of the above-described type, a bit pattern can be selected in the form of, for example, ×1 bit or ×4 bit.

FIGS. 9 and 10 illustrate patterns of the cases where ×1 bit and ×4 bit pattern are formed respectively in single chips. In order to make the explanation easy, each of FIGS. 9 and 10 schematically illustrates only the write data paths from the pads DQ0 to DQ3 to a memory cell array.

FIG. 9 shows write data paths of a ×4 bit pattern. In this case, output terminals of the input buffers DIB0 to DIB3, and input terminals of the write drivers DQWD are connected respectively to the input/output lines RWDn (n=0 to 3). 4-bit data input to the pads DQ0 to DQ3 are transmitted to the input/output lines RWDn via the input buffers DIB0 to DIB3. The data transmitted to the input/output lines RWDn are supplied via the write drives DQWD to memory cells selected by a predetermined address Add.

FIG. 10 illustrates write data paths of a ×1 bit pattern. In this case, output terminals of the input buffers DIB0 to DIB3 are connected respectively to the input/output lines RWDn, and input terminals of the write drivers DQWD are connected to one of the input/output lines, that is, RWD0. Supposing a case of a 1-bit pattern and that data is input from the pad DQ0, the 1-bit data input to the pad DQ0 is transmitted to the input/output line RWD0 via the input buffer DIB0. The data transmitted to the input/output line RWD0 is supplied via each write driver DQWD to a memory cell selected by a predetermined address Add.

As described above, in the conventional DRAM, the ×1 bit pattern and ×4 bit pattern can be realized by one chip by changing the wiring connections of the write drives and the input/output lines. As a result, there are usually, in one chip, input/output lines RWDn as many as the number of times of an integer of that of the bit pattern. For example, supposing that there are four input/output lines RWD, in the case of the ×4 bit pattern, the write drivers are connected respectively to the input/output lines, and the write drivers are driven by the input buffers corresponding to the bit pattern. In the case of the ×1 bit pattern, all of the write drives are connected to one input/output line, and they are driven by one input buffer.

The cases shown in FIGS. 9 and 10 will now be more specifically described. Supposing, for example, that 16 write drives DQWD, 4 input/output lines RWDn and four input buffers DIBn (n=0 to 3) are used, in the case of the ×4 bit pattern, four write drives are connected to each of the input/output lines, and therefore the number of the write drivers which are connected to one input buffer is four. By contrast, in the case if the ×1 bit pattern, 16 write drives are connected to one input/output line as shown in FIG. 10, and therefore the number of the write drives connected to one input buffer is 16 (four times as many as that of the ×1 bit pattern case). As a result, in the case where the driving performance of the input buffer is the same as that of the ×4 bit pattern case, the driving performance is lowered.

Generally, in the case of a ×1 bit pattern, the driving performance of the input buffer is set equal to that of the ×4 bit pattern case, a high driving performance is required. In order to obtain a high driving performance, a transistor having a gate width of a large pattern is used for the input buffer, and therefore the size of the chip is inevitably increased.

Further, in the case where ×1 bit and ×4 patterns are set, the wiring connections between the write drives DQWD and the input/output lines RWDn are changed in each case. The input/output lines RWDn, and the wiring connecting the pads DQ0 to DQ34 to the input terminals of the input buffers DIB0 to DIB3 are formed by the same mask; however the wiring connecting the input/output lines RWDn to the write drives DQWD is formed by another mask different from the above mask. As a result, the expense (and labor) for designing the circuits and masks is increased. This problem becomes even more serious when the bit pattern which can be switched by one chip increases as x8, x16, x32, and so on.

BRIEF SUMMARY OF THE INVENTION

An object of the present invention is to provide a semiconductor integrated circuit device which can be easily manufactured, capable of changing its bit pattern without increasing the driving performance of the transistors or without increasing the expense or labor for designing.

The object of the present invention can be achieved by the following structures.

That is, a semiconductor integrated circuit comprising: a plurality of terminals for inputting/outputting signals; a plurality of buffer circuits arranged to correspond to the plurality of terminals; circuit means to which the plurality of buffer circuits are respectively connected, the circuit means being connected to a selected memory cell; and a plurality of wires for connecting at least one of the plurality of terminals to the plurality of buffer circuits, a position of the wire for connecting the at least one terminal to the plurality of buffer circuits being changed in accordance with a bit pattern of the memory cell. The current driving performance of the plurality of buffer circuits is set to a current driving performance of a maximum bit pattern.

With the above-described structure, the partial structure from the terminals to the circuit means does not vary regardless of a change in the bit pattern, and therefore it only suffices if the current driving performance of the buffer circuits is set to the current driving performance of the maximum bit pattern. Thus, the size of the transistors can be decreased.

Further, since the wires are formed in the final step of manufacture of the semiconductor integrated circuit, the designing of the mask can be made easy, and the time required to manufacture the semiconductor integrated circuit can be shortened.

Another structure is that, in addition to the above, the above circuit means comprises a decoder, to which output terminals of the plurality of buffer circuits are connected, for decoding the signals supplied via the plurality of buffer circuits; a memory cell array selected in accordance with the output signal of the decoder as at least one bank; the connection position of the wire being changed in accordance with the number of banks selected.

With the above structure, the bank pattern can be easily changed.

Another structure is that, in addition to the above, the above circuit means comprises a memory cell array; and a decoder, to which output terminals of the plurality of buffer circuits are connected, the decoder being a row decoder for selecting a word line of the memory cell array; the refresh cycle of the memory cell array being changed by changing the connection position of the wire connecting the input terminals to the buffers.

With the above structure, the refresh cycle of the memory cell array can be easily changed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a diagram showing the structure of a main portion of the first embodiment of the present invention;

FIG. 2 is a diagram showing the structure of a main portion of the first embodiment of the present invention;

FIG. 6A is a diagram showing the structure of the third embodiment of the present invention;

FIG. 6B is a diagram showing the operation of the case where the refresh cycle is 8k;

FIG. 6C is a diagram showing the operation of the case where the refresh cycle is 4k;

FIG. 6D is a diagram showing the operation of the case where the refresh cycle is 2k;

FIG. 9 is a diagram showing the structure of conventional write data paths of a x4 bit pattern; and FIG. 10 is a diagram showing the structure of conventional write data paths of a x1 bit pattern.

DETAILED DESCRIPTION OF THE INVENTION

Embodiments of the present invention will now be described with reference to accompanying drawings.

Figure 8:
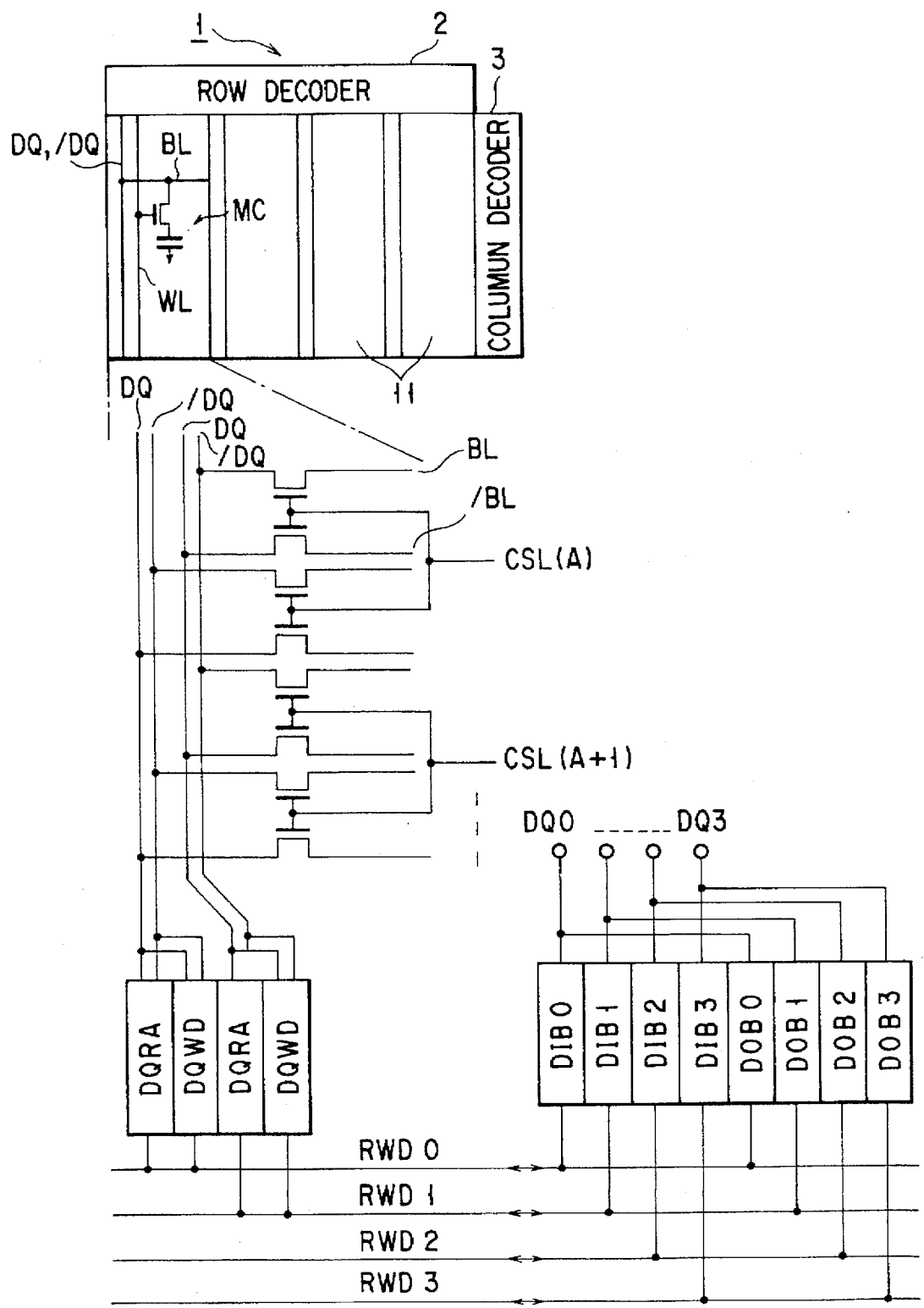
FIG. 8 is a circuit diagram specifically showing a part of the structure shown in FIG. 7.

FIG. 1 shows the first embodiment of the present invention, in which x1 bit and x4 bit patterns are realized by one chip. With regard to FIG. 1, the same structural members as those in FIGS. 8 to 10 are designated by the same reference numerals, and the descriptions therefor will not be repeated. It should be noted that the circuit for reading data is omitted from FIG. 1.

In FIG. 1, the input terminals of the write drivers DQWD and the output terminal of the input buffers DIB0 to DIB3 are connected respectively to the input/output lines RWDn. Supposing that the number of the write driver DQWD is 16, four write drivers DQWD are connected to each of the input/output lines. The wiring connection between the pads DQ0 to DQ3 and the input terminals of the input buffers DIB0 to DIB3 is formed in accordance with the bit pattern.

The wires La each represented by a broken line in FIG. 1 are used for the case where the semiconductor memory device is formed to be of the x4 bit pattern, whereas the wires Lb each represented by a dashed line in FIG. 1 are used for the case where the semiconductor memory device is formed to be of the x1 bit pattern. More specifically, in the case of the x4 bit pattern, the input pads DQ0 to DQ3 are connected to the input terminals of the input buffers DIB0 to DIB3, respectively, via the wires La, whereas in the case of the ×1 bit pattern, one of the input pads, that is, DQ0 is connected to each of the input terminals of the input buffers DIB0 to DIB3 via the wires Lb.

FIG. 2 shows a specific structure of the ×1 bit pattern.

As regard the above-described ×1 bit pattern, in order to write data into a memory cell, which is not shown, 1-bit data supplied to the input pad DQ0 are supplied to the four input buffers DIB0 to DIB3, and further supplied to the input/ output lines DIB0 to DIB3, respectively, via the input buffers DIB0 to DIB3. The data supplied to the input/output lines RWDn are written in a memory cell selected via one write driver DQWD selected by the address signal Add, and the data lines.

Figure 3:
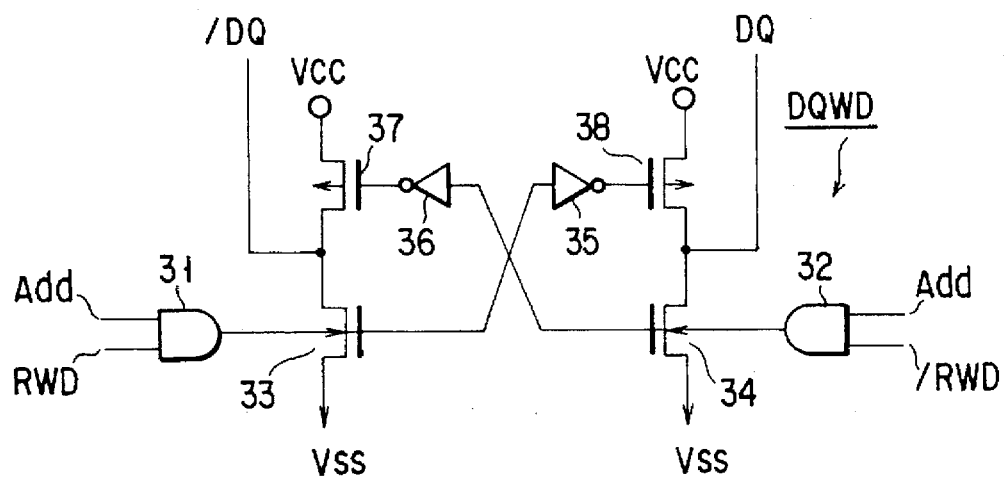
FIG. 3 is a circuit diagram specifically showing a write drive DQWD.

FIG. 3 shows an example of the write driver DQWD. As can be seen in FIG. 3, the input/output lines RWD and /RWD are supplied to the input terminals of AND circuits 31 and 32, respectively, together with the address signals Add. The symbol /RWD represents a reverse signal of RWD, and the reverse signal is generated by inverting a signal RWD by, for example, an inverter circuit, not shown. The output terminals of the AND circuits 31 and 32 are connected to the gates of N-channel transistors 33 and 34, respectively, and further connected to the input terminals of inverter circuits 35 and 36. The output terminals of the inverter circuits 35 and 36 are connected to the gates of P-channel transistors 37 and 38, respectively. The current paths of the P-channel transistors 37 and 38 are connected to the current paths of the N-channel transistors, and the connection points are connected to data lines /DQ and DQ, respectively.

The write driver DQWD having the above-described structure transmits the data of the input/output line RWD to the data lines /DQ and DQ when the input conditions of the AND circuits 31 and 32 are satisfied.

The write operation and read operation of data in the ×4 bit pattern are similar to those of the conventional case, and therefore they will not be repeated here.

Figure 4A:
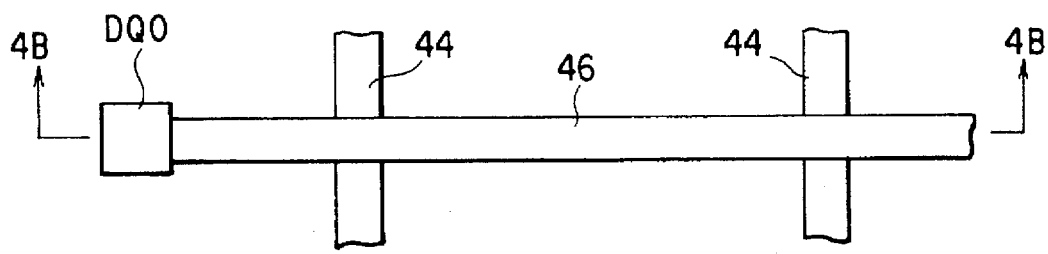
FIG. 4A is a plan view showing an example of the wiring between a pad and input buffer.
Figure 4B:
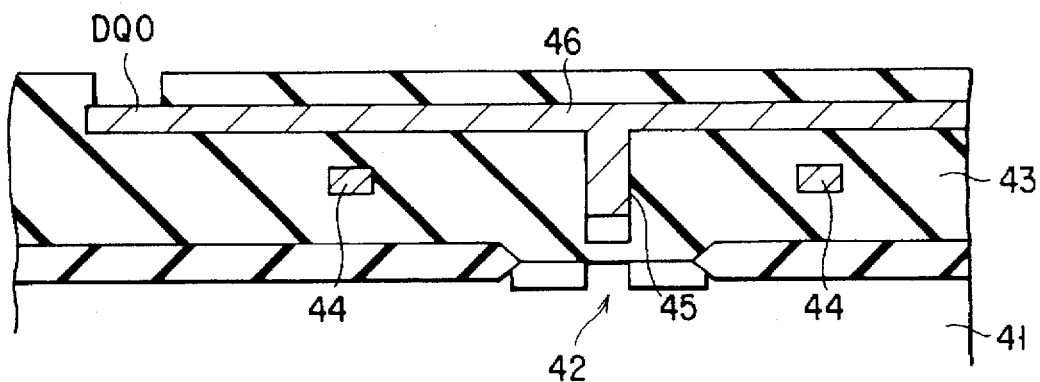
FIG. 4B is a diagram showing a cross section taken along the line 4B—4B shown in FIG. 4A.

FIGS. 4A and 4B illustrate an example of the wiring connected between the pads and the input buffers. Each of the pads and input buffers have the same structure, and therefore only the input buffer DIB0 and pad DQ0 will be explained below.

In a semiconductor substrate 41, a MOS transistor 42 which constitutes the input buffer DIB0 is formed. An insulation film 43 is provided on the MOS transistor 42, and a plurality of wires 44 of the first layer are provided in the insulation film 43. A contact hole 45 is formed in the insulation film 43 at a position corresponding to the gate of the MOS transistor 42, and a wire 46 of the second layer, which serves as the wires La or Lb, is connected to the gate via the contact hole 45. The pad DQ0 is connected to one end of the wire 46 of the second layer. In order to change the bit pattern, the position of the wire 46 of the second layer is changed.

In the above embodiment, the bit pattern of the semiconductor memory device is changed by changing the wiring connecting the input pads DQ0 to DQ3 to the input terminals of the input buffers DIB0 to DIB3, respectively. Therefore, between the case of the ×1 bit pattern and that of the ×4 bit pattern, there is no difference in the structure from the input buffers DIB0 to DIB3 to the memory cells. Therefore, the driving performance of the input buffers DIB0 to DIB3 can be made even between the case of the ×1 bit pattern and that of the ×4 bit pattern. Consequently, it suffices if the transistors which constitute the input buffers, have the current driving performance for the case of the ×4 bit pattern. In other words, even in the case where two or more bit patterns can be set, it suffices if the transistors which constitute the input buffers have the current driving performance for the case of the maximum bit pattern. Therefore, transistors of a small size can be used, and thus an increase in the pattern area can be avoided.

Further, the bit pattern of the semiconductor memory device is changed by changing the wiring connecting the input pads DQ0 to DQ3 to the input terminals of the input buffers DIB0 to DIB3, respectively. Consequently, it suffices only if the wiring connecting the input pads DQ0 to DQ3 to the input terminals of the input buffers DIB0 to DIB3, is examined. Thus, it is not necessary to examine the wirings of a plurality of sections as in the conventional technique, and the examination can be simplified.

Further, the wiring connecting the input pads DQ0 to DQ3 to the input terminals of the input buffers DIB0 to DIB3, is the uppermost wiring of the semiconductor memory device. In other wards, this wiring is the one formed in the final step of the manufacture of the semiconductor memory device. In this embodiment, only this wiring should be changed. Therefore, it is not necessary to change a wiring section in an intermediate step of the manufacture of the device, unlike in the conventional technique. Thus, the designing of the mask can be simplified. Further, the number of masks can be reduced, and therefore the maintenance of the masks can be made easy. Furthermore, in this embodiment, it suffices if only the final wiring portion is changed. Therefore, the time required for manufacturing the semiconductor memory device can be shortened as compared to that of the conventional case in the manner that the steps prior to the final step of forming the uppermost wiring are carried out in advance, and the final step of the uppermost wiring is carried out in accordance with the bit pattern.

Figure 5:
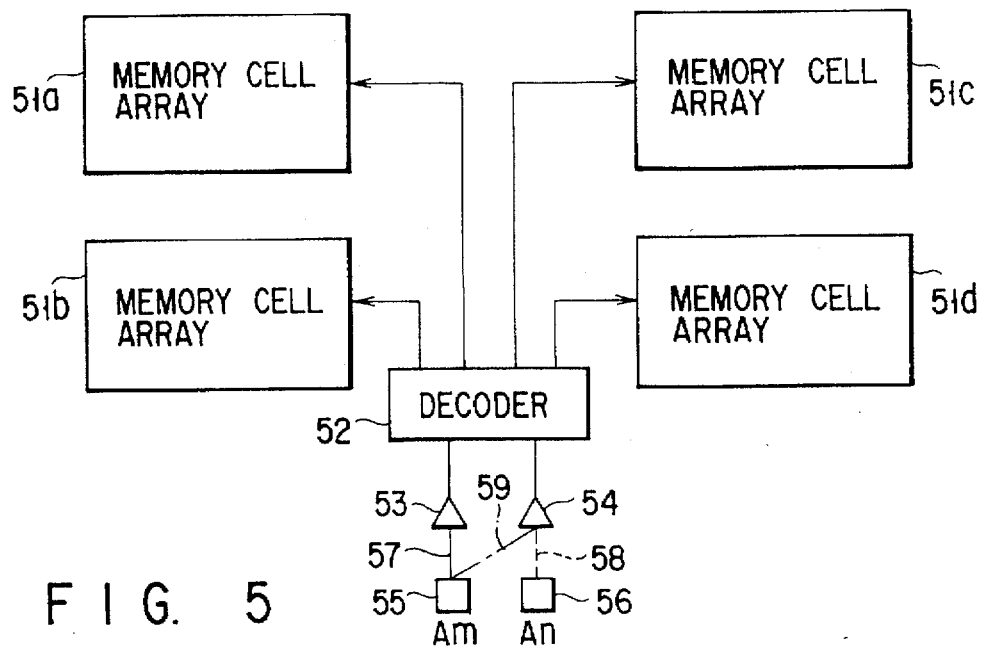
FIG. 5 is a diagram showing the structure of the second embodiment of the present invention.
Figure 7:
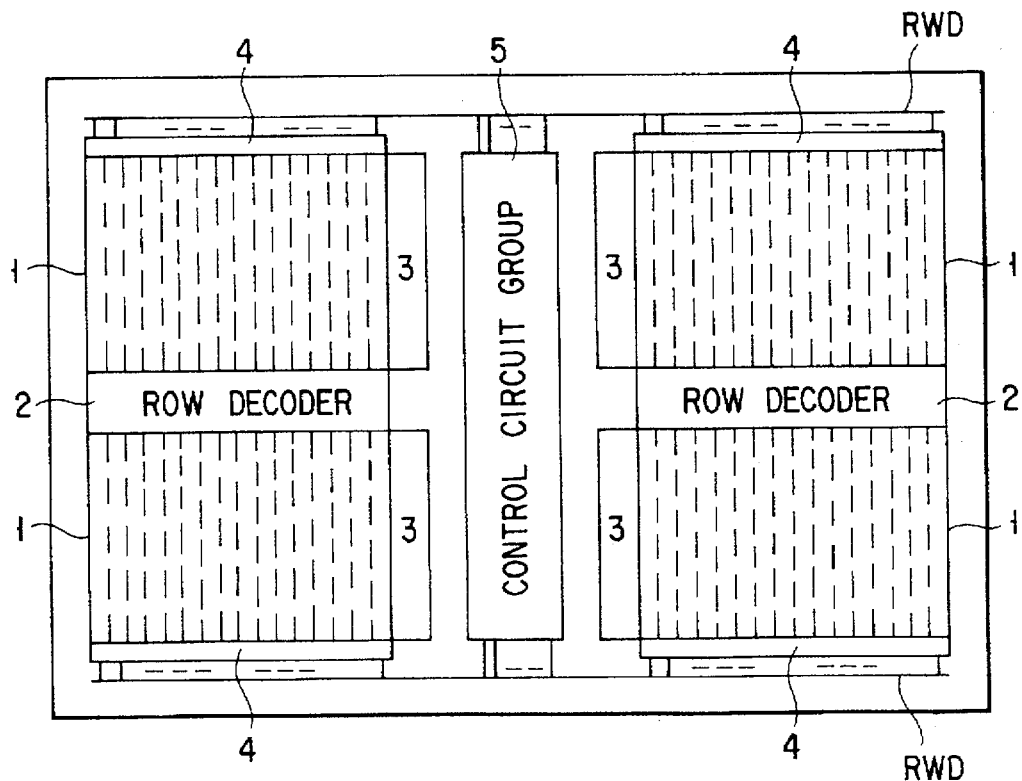
FIG. 7 is a plan view showing the chip structure of a RAM.

FIG. 5 shows the second embodiment of the present invention, which is an example in which the present invention is applied to the case where the bank pattern of, for example, a synchronous DRAM (to be called SDRAM hereinafter) is switched. The SDRAM includes a plurality of independent memory banks consisting of a plurality of memory cell arrays, within one chip. In the case where the SDRAM is used as a cache memory, a so-called cache miss, that is, the absence of address and data required by a CPU in a memory, can be prevented. The memory of this type is designed so that the bank pattern in the chip can be changed, and a desired bank pattern is set during the manufacture of the device.

As shown in FIG. 5, the output terminals of the decoder 52 are connected to a plurality of memory cell arrays 51a, 51b, 51c and 51d which constitute the memory bank. The output terminals of address buffers 53 and 54 are connected to the input terminals of the decoder 52. The input terminals of the address buffers 53 and 54 are appropriately connected via wires to pads 55 and 56, to which bank addresses Am and An are supplied. In other words, the input terminal of the address buffer 53 is connected to the pad 55 via a wire 57, regardless of the bank pattern, and the wiring of the input terminal of the address buffer 54 is changed in accordance with the bank pattern. In the case where the SDRAM is formed to be of the 4 bank type, for example, the pad 56 is connected to the input terminal of the address buffer 54 via a wire 58 indicated by a broken line in the figure. By contrast, in the case where the SDRAM is formed to be of the 2 bank pattern type, the pad 55 is connected to the input terminal of the address buffer 54 via a wire 59 indicated by a one dashed line in the figure. These wires 57 and 58 are of the wiring of the second layer, for example, and they are formed in the final step.

According to the second embodiment, the bank pattern can be easily changed by changing the wiring between the pads 55 and 56 and the input terminals of the address buffers 53 and 54. Further, the structure between the address buffers 53 and 54 and the memory cell arrays 51a to 51b is common to all the bank patterns, and therefore the performances of the bank patterns during the address transition can be made uniform.

FIGS. 6A to 6D illustrates the third embodiment of the present invention, which is an example in which the present invention is applied to the case where the refresh cycle of a DRAM, for example, is changed.

As can be seen in FIG. 6A, the output terminals of address buffers 63, 64 and 65 are connected to a row decoder 62 of a memory cell array 61. The input terminals of the address buffers 63, 64 and 65 are appropriately connected via wires to pads 66, 67 and 68, to which bank addresses Am, An and Ao are supplied. More specifically, in the case where the refresh cycle is 2k, 4k and 8k, a wire 69 connects the pad 66 and the address buffer 63 to each other.

In the case where the refresh cycle is 8k and 4k, a wire 70 connects the pad 67 and the address buffer 64 to each other.

In the case where the refresh cycle is 8k, a wire 71 connects the pad 68 and the address buffer 65 to each other.

In the case where the refresh cycle is 4k, a wire 72 connects the pad 67 and the address buffer 65 to each other.

In the case where the refresh cycle is 2k, wires 73 and 74 connect the pad 66 and the address buffers 64 and 65 to each other.

These wires 69, 70, 71, 72, 73 and 74 are, for example, of the wire of the second layer, and are formed in the final step.

By connecting the pads 66, 67 and 68 to the input terminals of the address buffers 63, 64 and 65 as described above, the refresh region can be set in accordance with the addresses Am, An or Ao as shown in FIG. 6B, 6C or 6D. FIG. 6B shows the case where the refresh cycle is 8k, FIG. 6C shows the case where the refresh cycle is 4k, and FIG. 6D shows the case where the refresh cycle is 2k.

Further, in the third embodiment, only the wiring connecting the address buffers 63, 64 and 65 and the pads 66, 67 and 68 to each other, is changed, and the wiring between the address buffers 63, 64 and 65 and the memory cells is not changed. Therefore, the performances of all the refresh cycles can be made uniform.

Lastly, the descriptions of the above embodiments are directed to the cases of a DRAM and SDRAM; however the present invention is not limited to these cases, but can be applied to semiconductor integrated circuit devices other than memories, such as a logic integrated circuit.

Additional advantages and modifications will readily occur to those skilled in the art. Therefore, the invention in its broader aspects is not limited to the specific details and representative embodiments, shown and described herein. Accordingly, various modifications may be made without departing from the spirit or scope of the general inventive concept as defined by the appended claims and their equivalents.

We claim:

1. A semiconductor integrated circuit comprising:

a plurality of terminals for inputting/outputting signals;

a plurality of buffer circuits arranged to correspond to said plurality of terminals;

a plurality of transmission paths for transmitting signals, to which said plurality of buffer circuits are respectively connected, said plurality of transmission paths being connected to a selected memory cell; and a plurality of wires for connecting at least one of said plurality of terminals to said plurality of buffer circuits, a position of the wire for connecting said at least one terminal to said plurality of buffer circuits being changed in accordance with a bit pattern of said memory cell.

2. A circuit according to claim 1, wherein a current driving performance of said plurality of buffer circuits is set to a current driving performance of a maximum bit pattern.

3. A circuit according to claim 1, wherein said wire is positioned uppermost portion of said semiconductor integrated circuit.

4. A circuit according to claim 1, wherein said wire is a wire formed in a final step of manufacture of said semiconductor integrated circuit.

5. A circuit according to claim 1, wherein said plurality of terminals are input terminals.

6. A circuit according to claim 1, further comprising a plurality of write circuits connected respectively to said plurality of transmission paths, said plurality of write circuits writing data in said selected memory cell.

7. A semiconductor integrated circuit comprising:

a plurality of input terminals for receiving input signals;

a plurality of buffer circuits arranged to correspond to said plurality of input terminals;

a decoder, to which output terminals of said plurality of buffer circuits are connected, for decoding said input signals supplied via said plurality of buffer circuits;

circuit means selected in accordance with an output signal from said decoder; and at least one wire for connecting at least one of said plurality of input terminals to at least one of said plurality of buffer circuits, a position of said at least one wire being changed in accordance with the number of said circuit means selected.

8. A circuit according to claim 7, wherein said circuit means is made of a plurality of memory cell arrays which constitute a plurality of banks, and said decoder selects at least one of said plurality of banks in accordance with an input signal.

9. A circuit according to claim 7, wherein said circuit means is a memory cell array, said decoder is a row decoder for selecting a word line of said memory cell array, and a refresh cycle of said memory cell array is changed by changing a connection position of said wire connecting said input terminals to said buffer circuits.

10. A semiconductor integrated circuit comprising:

a plurality of input terminals for receiving input signals;

a plurality of buffer circuits arranged to correspond to said plurality of input terminals;

a plurality of transmission paths to which output terminals of said plurality of buffer circuits are respectively connected;

a plurality of write circuits, each having input terminals connected to said plurality of transmission paths, respectively, said plurality of write circuits writing signals supplied to said plurality of transmission paths into a selected memory cell; and at least one wire for connecting at least one of said plurality of terminals to said plurality of buffer circuits, said at least one wire being formed in an uppermost portion of said semiconductor integrated circuit, and a position of said at least one wire being changed in accordance with a bit pattern of said memory cell.

11. A circuit according to claim 10, wherein a current driving performance of said plurality of buffer circuits is set to a current driving performance of a maximum bit pattern.

12. A circuit according to claim 10, wherein said at least one wire is a wire formed in a final step of manufacture of said semiconductor integrated circuit.

13. A semiconductor integrated circuit comprising:
a plurality of input terminals for receiving address signals;
a plurality of buffer circuits arranged to correspond to said plurality of input terminals;
a decoder, to which output terminals of said plurality of buffer circuits are connected, for decoding said address signals supplied via said plurality of buffer circuits;
memory cell arrays selected in accordance with an output signal from said decoder, each of said memory cell arrays constituting a bank; and
at least one wire for connecting at least one of said plurality of input terminals to at least one of said plurality of buffer circuits, a position of said at least one wire being changed in accordance with the bank pattern of said memory cell array.

14. A circuit according to claim 13, wherein a current driving performance of said plurality of buffer circuits is set to a current driving performance of a maximum bit pattern.

15. A circuit according to claim 13, wherein said at least one wire is a wire formed in a final step of manufacture of said semiconductor integrated circuit.

16. A semiconductor integrated circuit comprising:
a plurality of input terminals for receiving address signals;
a plurality of buffer circuits arranged to correspond to said plurality of input terminals;
a row decoder, to which output terminals of said plurality of buffer circuits are connected, for decoding said address signals supplied via said plurality of buffer circuits;
a memory cell selected in accordance with an output signal from said row decoder; and
at least one wire for connecting at least one of said plurality of input terminals to at least one of said plurality of buffer circuits, a position of said at least one wire being changed in accordance with a refresh cycle of said memory cells.

17. A circuit according to claim 16, wherein a current driving performance of said plurality of buffer circuits is set to a current driving performance of a maximum bit pattern.

18. A circuit according to claim 16, wherein said at least one wire is a wire formed in a final step of manufacture of said semiconductor integrated circuit.

* * * * *